United States Patent
Hsu et al.

(10) Patent No.: US 6,751,152 B2
(45) Date of Patent: Jun. 15, 2004

(54) METHOD AND CONFIGURATION TO ALLOW A LOWER WORDLINE BOOSTED VOLTAGE OPERATION WHILE INCREASING A SENSING SIGNAL WITH ACCESS TRANSISTOR THRESHOLD VOLTAGE

(75) Inventors: Louis L. Hsu, Fishkill, NY (US); Toshiaki K. Kirihata, Poughkeepsie, NY (US); Daniel W. Storaska, Walden, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/999,379

(22) Filed: Oct. 31, 2001

(65) Prior Publication Data

US 2003/0081447 A1 May 1, 2003

(51) Int. Cl.[7] .............................. G11C 8/00; G11C 7/00
(52) U.S. Cl. ................................. 365/230.06; 365/203
(58) Field of Search ......................... 365/230.06, 203, 365/149, 207, 208; 257/337, 339; 438/239

(56) References Cited

U.S. PATENT DOCUMENTS

| | | | | |
|---|---|---|---|---|
| 5,900,665 A | * | 5/1999 | Tobita ........................ | 257/339 |
| 6,011,746 A | * | 1/2000 | Oh .......................... | 365/230.06 |
| 6,107,134 A | * | 8/2000 | Lu et al. ..................... | 438/239 |
| 6,111,802 A | * | 8/2000 | Kano et al. ............ | 365/230.06 |
| 6,147,914 A | * | 11/2000 | Leung et al. .......... | 365/230.06 |
| 6,195,305 B1 | * | 2/2001 | Fujisawa et al. ............ | 365/226 |

OTHER PUBLICATIONS

Konishi, Yasuhiro, et al. (1989) "Analysis of Coupling Noise Between Adjacent Bit Lines in Megabit DRAM's", *IEEE Journal of Solid State Circuits* 24 (1): 35–41.

Nakano, H., et al., (1996) "A Dual Layer Bitline DRAM Array With Vcc/Vss Hybrid Precharge for Multi–Gigabit DRAM's", *Symposium on VLSI Circuits of Technical Papers* 18 (1):190–191; and.

Sato, Hirotoshi, et al. (1998) "A 5–MHz, 3.6–3m W, 1.4–V SRAM With Nonboosted, Vertical Bipolar Bit–Line Contact Memory Cell", *IEEE Journal of Solid–State Circuits* 33 (11): 1672–1681.

* cited by examiner

Primary Examiner—Trong Phan
(74) Attorney, Agent, or Firm—Scully, Scott, Murphy & Presser; Robert A. Walsh, Esq.

(57) ABSTRACT

A memory array architecture employs a full Vdd bitline precharged voltage and a low wordline boost voltage, which is less than Vdd plus the threshold voltage of the access transistor. In a write mode, a first low level of a data bit is almost fully written to a storage element, however a second high level of the data bit is not fully written to the storage element. In a read mode, the first low level of the data bit is fully read out from the storage element, however the second high level of the data bit is not read out by utilizing the access transistor threshold voltage. This allows a sensing signal only with the first voltage level transfer to the Vdd precharged BL. A reference WL is preferably used for generating a reference bitline voltage for a differential Vdd sensing scheme. Alternatively, a single BL digital sensing scheme may be used. Lowering the wordline voltage results in a reduction in power consumption by saving power on Vpp generator and support circuits, and a reduction in the size of the Vpp generator and support circuits, and also eliminates high Vpp voltage related problems such as dielectric breakdown and other reliability concerns while avoiding a complex decoding scheme and saving cost.

15 Claims, 6 Drawing Sheets

VSIGhigh = (Vcell-high - 1/2VDD) x CS/(CS+CBL)
VSIGlow = 1/2VDD x CS/(CS+CBL)

VSIGhigh = 1/2VDD x CS/(CS+CBL)
VSIGlow = -1/2VDD x CS/(CS+CBL)

(INVENTION)

FIG. 10

$V_{pp} = <V_{cell\text{-}high} + V_{th}$ $V_{pp}$ = wordline boosted voltage $V_{cell\text{-}high}$ = physical 1 voltage $V_{th}$ = switching transistor threshold voltage $VDD - VDD \times CS/(CS+CBL)/2$ $VDD$ = voltage supply $CS$ = storage capacitance $CBL$ = bitline capacitance $VSIG_{high} = 1/2 VDD \times CS/(CS+CBL)$ $VSIG\ high$ = physical data bit 1

$VSIG_{low} = -1/2 VDD \times CS/(CS+CBL)$ $VSIG_{low}$ = physical data bit 0

$V_{cell\text{-}high} > V_{wl\text{-}r} - V_{th}$ $V_{wl\text{-}r}$ = wordline read voltage $V_{bl\text{-}pc} > V_{wl\text{-}r} - V_{th}$ $V_{bl\text{-}pc}$ = bitline precharge voltage

METHOD AND CONFIGURATION TO ALLOW A LOWER WORDLINE BOOSTED VOLTAGE OPERATION WHILE INCREASING A SENSING SIGNAL WITH ACCESS TRANSISTOR THRESHOLD VOLTAGE

BACKGROUND OF THE INVENTION

1. Field of the Invention

The present invention relates generally to a memory array architecture which allows a lower wordline boosted voltage ($V_{pp}$) operation while increasing the available sensing signal with an access transistor threshold voltage. A low $V_{pp}$ wordline operation results in a reduction in power consumption by saving power on Vpp generator support circuits, and a reduction in the size of the Vpp generator and support circuits, and also eliminates high Vpp voltage related problems such as dielectric breakdown and other reliability concerns while avoiding a complex decoding scheme and saving costs.

2. Discussion of the Prior Art

The evolution of submicron CMOS technology has resulted in a significant improvement in microprocessor speeds. Quadrupling roughly every three years, microprocessor speeds have now even exceeded 1 Ghz. Along with these advances in microprocessor technology have come more advanced software and multimedia applications, requiring larger memories for the applications thereof. Accordingly, there is an increasing demand for memories with higher density and performance. Today's multimedia computers require at least 641~28 MB, which increases the relative cost of the memories within the computer. In the near future, 256 MB or 1 GB computers will become commonplace, which suggests a potentially strong demand for 1 Gb DRAMs (Dynamic Random Access Memory) and beyond. Despite the huge size of the memory arrays and the lithographic difficulties that ensue, it is more important then ever to increase the manufacturing yield and reliability of the memory devices and memory systems containing a plurality of DRAMs. Process engineers constantly struggle to reduce and ultimately eliminate defects to improve yields and reliability. A significant cause of yield and reliability problems are failures due to a high voltage device stress.

Memory cells in a DRAM are typically accessed by boosting the wordline voltage (Vpp) to be higher than the voltage supply (Vdd). Therefore, access gates of the cells, wordline drivers, and their high voltage generator circuitry are key to improve device yield and reliability. For example, for a 1 Gb stand-alone conventional DRAM, for a Vdd of 2V, Vpp must be 3.3V or higher.

The reasons for such a high boosted Vpp voltage are:

(1) Conventional DRAMs use only the capacitive charge stored in the cell, which requires a higher voltage level to transfer a physical 1 data charge to the bitline, otherwise the read speed for reading a physical 1 data from the cell is degraded.

(2) For a write operation, the Vpp level should be higher than the voltage supply Vdd by at least the threshold voltage (Vth) of the access gate transistor to avoid a threshold voltage drop for writing a physical 1 data bit to the cell.

(3) The data stored in a DRAM memory cell is destroyed after a read operation. In order to restore the data to the cell after data sensing in a read operation, a write-back operation using a boosted Vpp voltage is needed to avoid the Vthn voltage drop. Increasing the boosted wordline voltage Vpp may be preferable to enhance the write back speed.

(4) In a conventional DRAM array, in order to prevent sub-threshold leakage and to maintain the memory cell retention quality, a transfer device (access gate transistor) with a high threshold voltage Vthn (i.e. 0.7V to 1.2V) is required. In order to perform a full signal write operation, a high Vpp is critical. In short, in a conventional DRAM array, if the Vpp level is not sufficient, the physical "1" signal stored in the cell is degraded which eventually leads to a data retention problem.

The drawbacks of using a boosted Vpp are:

(1) A requirement for a high efficiency charge pump to provide a Vpp level with a sufficient current supply. This becomes harder and harder as the Vdd level is continuously reduced corresponding to improved technology scaling. The pumping efficiency of a Vpp generator is drastically reduced when Vdd is less than 1.5V. Sometimes, to get a high Vpp level (>2.2V), a cascaded pump configuration, or two groups of pumps connected in series, is used. This means more power consumption, and also certainly more chip area.

(2) A high Vpp level causes reliability concerns on the gate dielectrics of devices having high Vpp stress. These devices include decoders, wordline drivers, multiplexers, level-shifters, and some critical devices in the charge pumps, etc.

(3) A larger chip size is needed in order to provide the stressed devices which have a longer channel length and a wider channel width. To minimize the stress, sometimes extra buffer devices, level shifters, etc. are added, all of which result in a larger chip area and increased process complexity.

(4) Furthermore, in order to minimize the stress, a thicker gate oxide and a special timing for WL decoding are necessary, which result in increased design/process complexity, degraded performance and higher cost.

The prior art detects a data bit in a memory cell by detecting first or second states of the cell voltage (0 or 1). The drawback of this method is that the sensing signal depends on both the first and second states stored in the cell. If the wordline WL is not boosted, the second state 1 has less voltage, thus reducing the available sensing signal (the voltage difference between the first and second states).

SUMMARY OF THE INVENTION

Accordingly, it is a primary object of the present invention to provide a DRAM memory array architecture which allows a low $V_{pp}$ wordline operation.

A further object of the subject invention is to significantly reduce the $V_{pp}$ (boosted wordline voltage) level, or to completely eliminate a high $V_{pp}$ level from a DRAM memory array.

Another object of the present invention is to provide a scheme to reduce Vpp to as low as 1.6V for a write operation and 1.2V for a read operation, while still achieving high performance read/write operations.

A further object of the subject invention is to provide a low Vpp architecture while maintaining or even increasing the available sensing signal.

Another object of the present invention is to eliminate high Vpp voltage related problems, such as dielectric breakdown and other reliability concerns, to significantly reduce the size of support circuits, to avoid a complex decoding scheme, and to save cost.

The present invention detects a data bit in the cell by transferring the first state 0 to the bitline BL. The cell voltage transfer of the second state is limited by using a low Vpp in a read mode. A data bit can be sensed by detecting the BL voltage after the signal development, which depends on only the first data bit state voltage. Therefore even if the wordline WL is not boosted, the signal is not lost as long as the first state 0 can be fully written to or read from the cell.

BRIEF DESCRIPTION OF THE DRAWINGS

The foregoing objects and advantages of the present invention may be more readily understood by one skilled in the art with reference being had to the following detailed description of several preferred embodiments thereof, taken in conjunction with the accompanying drawings wherein like elements are designated by identical reference numerals throughout the several views, and in which:

FIG. 10 illustrates a summary of the equations explained below and also used in the claims.

DETAILED DESCRIPTION OF THE DRAWINGS

Figure 1:
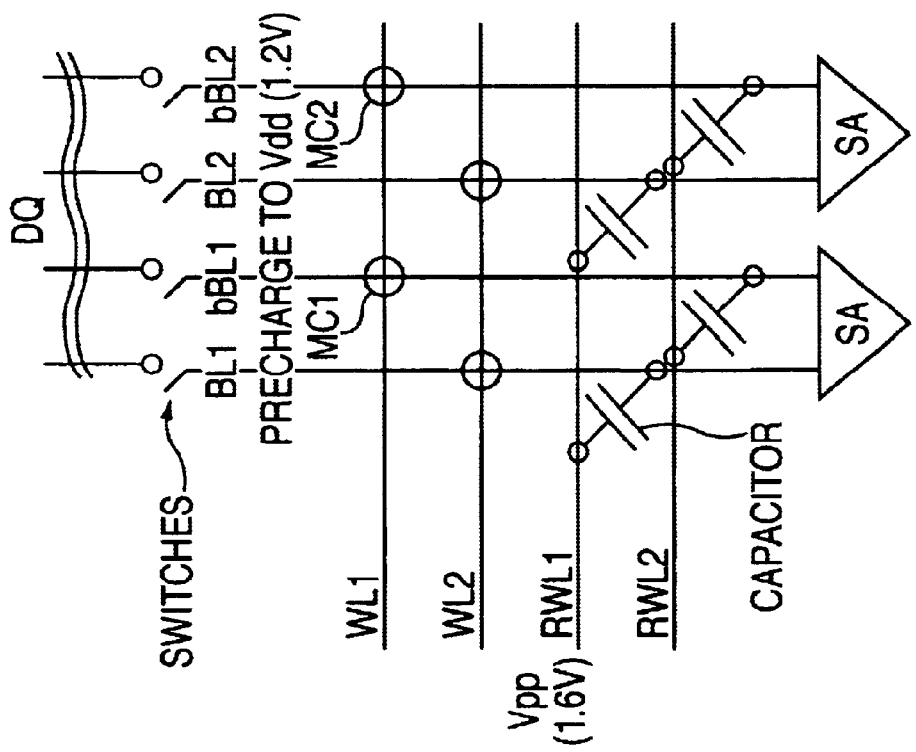
FIG. 1 illustrates a DRAM memory array with a Vdd sensing scheme which allows a lower wordline boosted voltage Vpp operation while increasing the available sensing signal with access transistor threshold voltage.

FIG. 1 illustrates a DRAM memory array with a Vdd sensing scheme which allows a lower wordline boosted voltage Vpp operation while increasing the available sensing signal with access transistor threshold voltage. This array organization is well known, however, a voltage relation between a BL precharged voltage (VDD) and a WL boosted voltage (VPP) is unique for this invention. The bitlines and complementary bitlines BL1, bBL1 and BL2, bBL2 are precharged to Vdd (e.g. 1.2V) as long as a signal EQ (active low) is low. A typical DRAM memory array includes thousands of wordlines WL1, WL2. In order to generate a reference voltage due to a Vdd precharged BL, two reference wordlines RWL1, RWL2 are additionally provided. For simplicity, a reference wordline RWL1 and RWL2 generates a reference bitline voltage by the capacitive coupling effect, as shown by the capacitors in FIG. 1. However, for an actual implementation, any other method (with a reference cell or a reference voltage generator) can be employed to generate a reference BL voltage. The details of the sensing operation with the reference voltage are described next.

Figure 2:
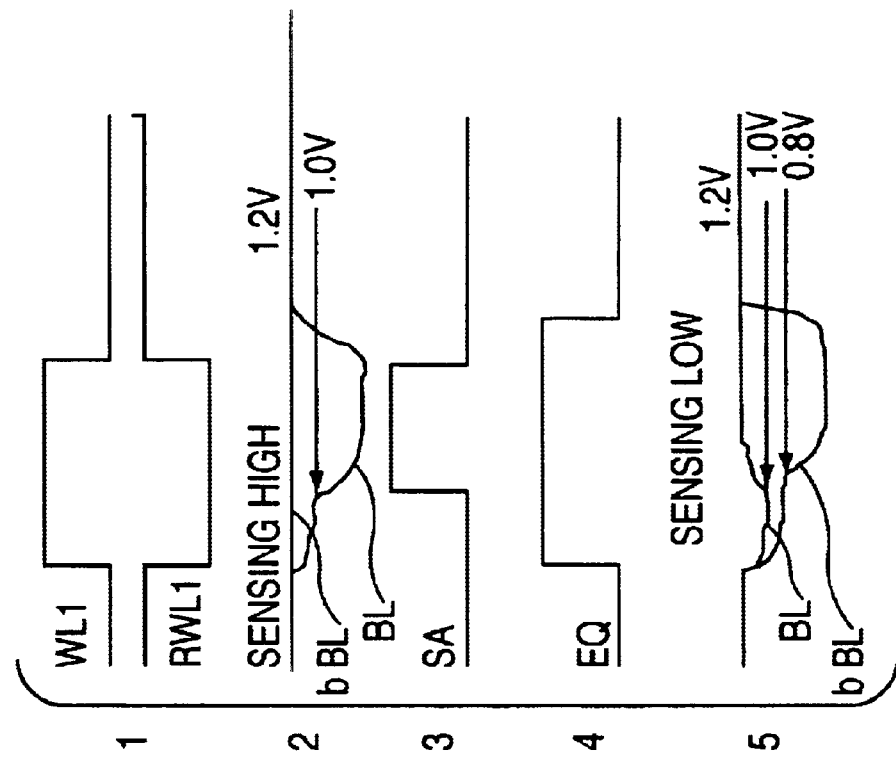
FIG. 2 illustrates waveforms for a read operation for the DRAM memory array of FIG. 1.

Before activating the WL and RWL, a signal EQ goes high, disabling a BL precharging operation. A wordline WL1 (active high) and a corresponding reference wordline RWL1 (active low) are then activated, as shown in FIG. 2-1. As a result, a signal is developed on each bitline (bBL1 and bBL2) by transferring capacitive charge from the corresponding memory cell (MC1, MC2). The bitline voltage (bBL1 and bBL2) therefore keeps the voltage (1.2V), as shown in FIG. 2-2, or goes low (0.8V), as shown in FIG. 2-5, depending on whether the data bit stored in the corresponding cell is a 1 or a 0 respectively. Reference bitlines (BL1 and BL2) are coupled by the reference wordline RWL1, lowering the BL1 and BL2 voltages (1.0V). Thus, a differential voltage is generated in the BL1, bBL1 pair and in the BL2, bBL2 pair, which is defined as the sensing voltage.

If a physical 1 data (Vdd=1.2V) is transferred to the bBL, the bBL voltage (1.2V) is maintained, because the bBL precharged voltage is originally Vdd (1.2V). Therefore, the bBL voltage (1.2V) is higher than the BL voltage (1.0V), as shown in FIG. 2-2, of the pair.

If a physical 0 data (0V) is transferred to the bBL, the bBL voltage (0.8V) is lower than the reference BL voltage of the pair (1.0V), as shown in FIG. 2-5. Note that the capacitance between BL and RWL should be adjusted so that the reference BL voltage becomes a middle voltage (1.0V) between the bitline high and low voltages (1:1.2V and 0:0.8V) after the physical 1 data and the physical 0 data has been transferred.

Optionally, a voltage swing of the RWL may be adjusted to set a reference BL voltage, which is well known and not discussed.

A differential sense amplifier SA is coupled to each bitline pair (BL1 and bBL1/BL2 and bBL2). The SA amplifies the differential signal on each BL pair when a signal SA goes high, as shown in FIG. 2-3.

For reading a physical "1", as shown in FIG. 2-2, the bitlines bBL and BL go high (1.2V) and low (0V), respectively.

For reading a physical "0", as shown in FIG. 2-5, the bitlines bBL, BL go low (0V) and high (1.2V), respectively. A typical differential SA is a CMOS cross-coupled SA, which is well known and not discussed.

Figure 4:
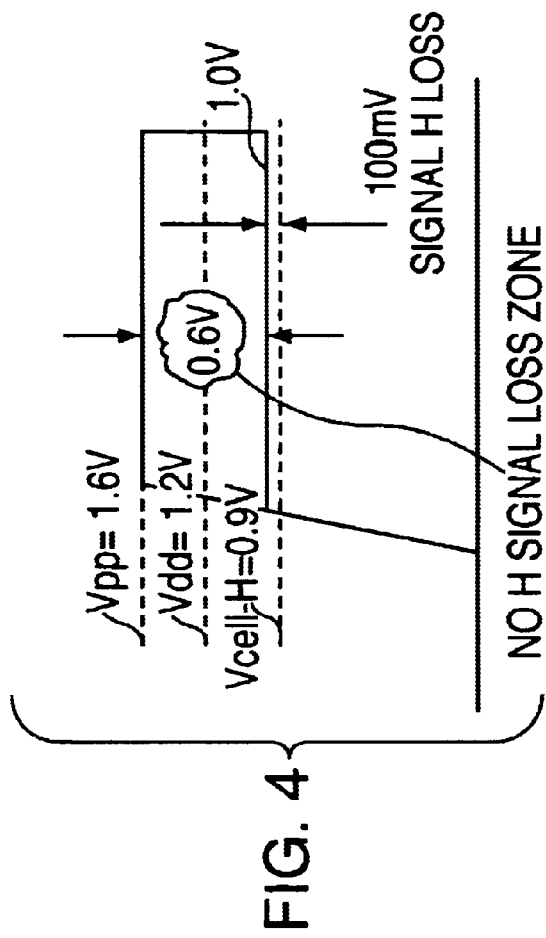
FIG. 4 illustrates why a full physical "1" level of 1.2V is not necessary to be written into a memory cell connected as illustrated in FIGS. 1 and 3, and shows that as long as the physical "1" is greater than Vpp−Vthn (1.6V−0.6V=1.0V), there will be no signal loss during a read operation, as shown by the shaded zone of FIG. 4 extending from 1.0V to 1.6 V.
Figure 3:
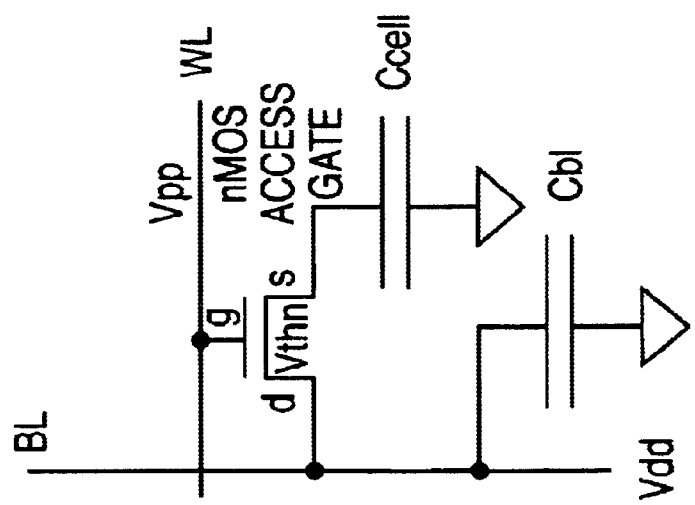
FIG. 3 illustrates the connection of a DRAM memory cell as in FIG. 1 by an nMOS access gate transistor to an associated wordline WL and an associated bitline BL.

In a precharge phase, all bitlines are precharged to Vdd (1.2V) by activating an equalization signal EQ (active low), shown in FIG. 2-4, to a low state. This concludes a read operation for the memory cells.

A unique feature of the present invention is to use a low Vpp WL voltage. Referring to FIG. 1, during a write operation, data is transferred from data busses (or DQ lines) via switches directly to the bitlines or through sense amplifiers to the bitlines. If the Vpp level is reduced (e.g. from 2.1V to 1.6V), a full high-level will not be written into the cells. The actual capacitive charge for a physical 1 data stored in a cell is therefore smaller than that from the charge obtained with a full boosted Vpp (2.1V). A unique feature of the present invention is the ability to obtain a large sensing signal even if the cell charge is reduced due to a lower Vpp level.

Figure 5:
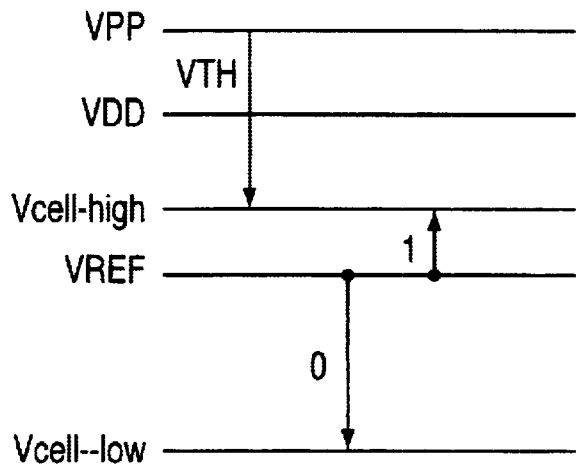
FIGS. 5 and 6 illustrate respectively a comparison of signal development and signal sensing margin between the conventional prior art approach using Vdd/2 sensing, and the present invention using Vdd sensing.
Figure 6:
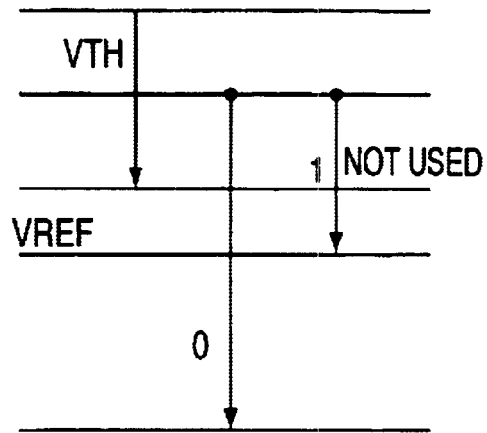

The concept of the present invention can be better understood from the following discussions. FIGS. 5 and 6 show two methods (prior art and invention) to detect a data bit in a memory cell, wherein Vpp is the wordline boosted voltage, Vdd is the bitline voltage for writing 1, Vref is a reference voltage, Vth is the access transistor threshold voltage, and Vcell-high and Vcell-low are the high and low voltage levels stored in a cell. Vref is typically set at ½ Vdd, which is an ideal point assuming that a full Vdd voltage for a one and 0V for a zero are written to the cell.

If the wordline boosted voltage (Vpp) is reduced, the voltage Vcell-high is reduced due to the threshold voltage (Vth) of the access transistor, regardless of the BL voltage. Thus, detection of the Vcell-high voltage would be difficult in the prior art because the capacitive charge transferred from the cell would be small. To overcome this problem, the Vref level could be set at the level between Vcell-high and Vcell-low, however a signal loss would be expected anyway if Vpp is reduced.

The present invention does not use a Vcell-high for sensing. More particularly, the present invention uses a storage charge for a physical 0, but does not use a storage charge for a physical 1. This is realized by employing a Vdd precharged BL and the threshold voltage drop of the access transistor (Vth) in a read mode. As long as the Vpp voltage in a read mode is equal to or smaller than a physical 1 voltage (Vcell-high) written to the cell plus the threshold voltage Vth, (Vpp<Vcell-high+Vth), then the bitline BL maintains the precharge voltage (Vbl-pc) of Vdd due to the threshold voltage of the access gate transistor Vth as long as the BL precharge voltage (Vbl-pc) of Vdd is higher than the physical 1 voltage defined by the wordline read voltage less the access transistor threshold voltage (Vth). A physical 0 voltage can be fully transferred to the BL, because the gate overdrive of the 0 data bit is sufficient, making the BL go low when the access gate opens. A data bit can be sensed by detecting the BL voltage after the signal development, which depends on only the 0 data bit in the cell. By employing this concept, writing a full high level (or 1.2V) is not necessary as long as a full zero level (0V) can be written and read through the access transistor. It is theoretically possible to maintain the Vdd precharge voltage if the voltage drop between write and read operations is the same, even if a full physical 1 voltage is not written to the cell due to a lower Vpp WL operation. Optionally, a higher write Vpp voltage (e.g. 2.0V) and a lower read Vpp voltage (e.g. 1.6V) can be implemented to ensure a design margin for physical 1 data to improve data retention time.

The equations in FIGS. 5 and 6 summarize theoretical sensing signals (VSIG-high for a data bit 1 and VSIG-low for a data bit 0) defined by a difference between BL and $\overline{BL}$, where CBL and CS are the bitline and storage capacitances. In FIG. 5, which illustrates the prior art, VSIGhigh=(Vcell-high−½VDD)×CS/(CS+CBL), and VSIGlow=½VDD×CS/(CS+CBL), whereas FIG. 6 illustrates the present invention wherein VSIGhigh=½VDD×CS/(CS+CBL), and VSIGlow=−½VDD×CS/(CS+CBL). Note that the sensing signal VSIGhigh in the present invention does not contain the parameter of Vcell-high, allowing an insufficient storage charge for the physical one data bit without reducing a sensing signal. On the other hand, the sensing signal VSIGhigh in the prior art contains the parameter of Vcell-high, reducing a sensing signal if Vcell-high is not fully written to the cell.

FIG. 3 shows a transistor level schematic for the memory cell, where a bitline BL is precharged to Vdd, and a wordline WL is set to Vpp, the boosted WL voltage. A transfer device (access gate transistor) having a threshold voltage Vth has its drain (d) connected to BL=Vdd, its gate (g) connected to WL=Vpp, and its source (s) capacitive coupled to a memory cell indicated by Ccell. The bitline BL is also shown with capacitive coupling Cbl to the reference wordline RWL. The access gate transistor is turned off if the stored cell voltage is equal to or higher than Vpp−Vthn if the BL is precharged to Vdd. Note that a physical "0" data can be read correctly, because the access transistor gate would be on, because the source (s) of the access transistor is at the cell voltage of 0V.

FIG. 4 illustrates why a full physical "1" level of 1.2V is not necessary to be written into a memory cell to keep a sensing signal as obtained if a full physical "1" level of 1.2V is written to the cell. Assume that Vcell-high=0.9V, Vdd=1.2V, Vpp=1.6V, and the cell threshold voltage Vthn=0.6V. Because of the Vthn threshold drop in a read mode, a sensing signal can be maintained if the storage voltage stores a voltage higher than Vpp−Vthn, which is 1.0V. FIG. 4 illustrates that for a sensing signal between Vpp=1.6 and 1.0V, there is a no H signal loss zone, whereas for a sensing signal between 1.0V and Vcell-high=0.9V, there is a 100 mV signal H loss zone.

In summary, the present invention writes a nearly full low 0 voltage level and an insufficient high 1 voltage level to the memory cell by utilizing the threshold voltage of the switching transistor. The invention allows the nearly full low 0 voltage to be transferred to the BL. An insufficient high 1 voltage transfer is limited by utilizing the threshold voltage of the access transistor and the Vdd precharged BL. The low voltage level is 0V, and a nearly full voltage (0V) is written to the cell in a write mode by applying a wordline voltage which is larger than the threshold voltage. The insufficient high voltage level is determined by the wordline voltage in a write mode minus the threshold voltage of the access transistor. The nearly full low voltage level is read by applying a wordline voltage which is larger than the threshold voltage of the access transistor. The insufficient high voltage level is not read by applying the wordline voltage in a read mode to be equal to or less than the wordline voltage in a write mode.

The concept of the invention can be extended to improve retention time by changing the WL Vpp voltage between a read mode and a write mode. Typically, a physical 1 data is leaked due to a junction leakage, which is a key for data retention time. However, by applying a higher WL voltage in a write mode, the Vpp WL voltage difference between the write operation and the read operation can increase the signal margin for a physical 1. This is because as long as the cell high voltage is greater than Vg (Vgate)−Vthn, the transfer device is basically shut off.

Figure 7:
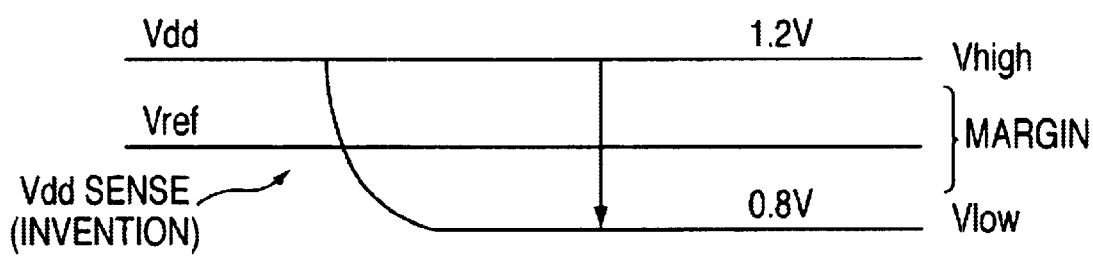
FIG. 7 shows a comparison of the signal development and signal margin between the present invention and the conventional approach using Vdd/2 sensing.
Figure 7:
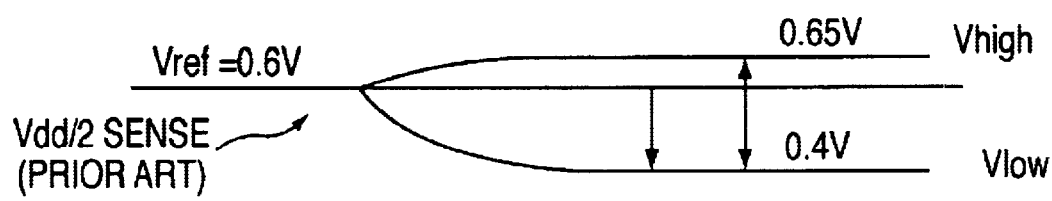

FIG. 7 shows a comparison of the signal development and signal margin between the present invention and the conventional approach. The top of FIG. 7 illustrates Vdd SENSE (the invention) compared with Vdd/2 SENSE (the prior art) in the bottom of FIG. 7. The top of FIG. 7 illustrates Vhigh=the power supply voltage Vdd=1.2V, and Vref is preferably halfway between Vhigh and Vlow=0.8V, whereas in the prior art (Vdd/2 SENSE) Vhigh=0.65V, Vlow=0.4V, and Vref=0.6V. A voltage, VREF, is a reference voltage generated on a reference bitline (the other bitline of the BL and bBL pair) to detect a data bit (0 or 1). More particularly, if the BL voltage is higher than the VREF, a data bit 1 is detected. Similarly, if the BL voltage after the signal development is lower than the VREF, a data bit 0 is detected. The upper diagram is the signal development of the present invention. For reading with Vpp=1.6V, with both a cell high, shown as Vhigh, of 1.2V and a cell low, shown as Vlow, of 0V, a full signal margin, shown as MARGIN, e.g. 400 mV (or +/−200 mV) can be developed. The high level of the bitline during sensing is unchanged since the transfer device is off. The low level is quickly developed due to a strong Vds (voltage across the access transistor drain to source). However, for the conventional sensing approach shown in the lower diagram, the high signal suffers a significant loss. This is because a low Vpp read operation gate over-drive degrades a physical "1" data due to a threshold drop, resulting in a small sensing signal.

The discussion above assumes an NMOS array with a VDD sensing scheme, however the concept can be applied to PMOS array DRAMs with a Ground (Gnd) sensing scheme. For a PMOS array with a GND sensing scheme, only a physical 1 data bit is used for sensing, while limiting a signal read for insufficient voltage of the physical 0 with the PMOS array access gate threshold voltage.

Figure 8:
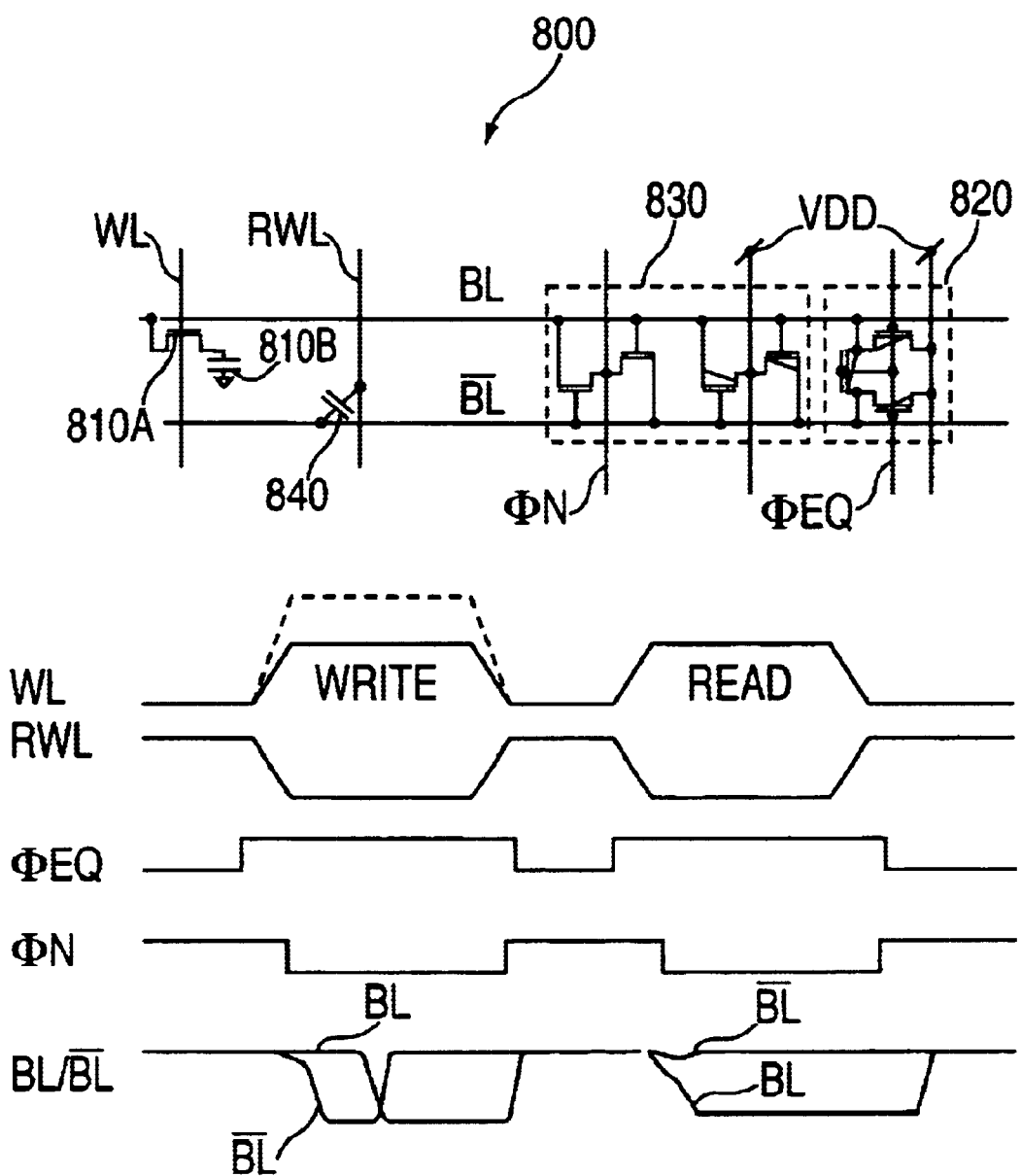
FIG. 8 illustrates a preferred embodiment of a transistor schematic pursuant to the present invention and waveforms of its operation.

FIG. 8 illustrates a preferred embodiment of a transistor schematic pursuant to the present invention. A memory array 800 comprises a plurality of memory cells, each consisting of a capacitor 810B and a switching transistor 810A. In this example, an NMOS access or swinging transistor is preferably used. The storage element keeps the voltage in a capacitor 810B. More specifically, the capacitor 810B stores a physical 1 data (VDD) and a physical 0 data (0V) as a data bit. It is assumed that a physical 1 data is not fully written, but that the physical 0 data is nearly fully written. Capacitor 810B couples to a bitline BL through the switching transistor 810A when the wordline WL goes high. The bitlines are precharged to Vdd through bitline equalizing PMOS transistors 820. Prior to the WL activation, a signal ΦEQ goes high, disabling the BL precharging operation. The WL is then activated.

A key aspect of the present invention is that a high wordline voltage level in a read mode (Vwl-r=Vpp) is equal to or lower than the level of an insufficient physical high voltage (Vcell-high) stored in the storage element 810B plus a threshold voltage (Vth) of the access transistor as long as the BL precharge voltage (Vbl-pc) is equal to or higher than the Vwl-r minus Vth. This relation (Vwl-r=<Vth+Vcell-high and Vbl-pc>=Vwl-r−Vthn) allows only a voltage for a physical 0 data bit to be transferred to the bitline in a read mode.

In summary, the BL maintains Vdd for reading a physical 1 data bit from the memory cell 810 even if the physical 1 data bit is not fully written to the cell. On the other hand, the BL goes low when the voltage for the physical 0 data is fully transferred, because the gate overdrive for the access gate for reading a physical 0 data voltage is sufficient. The BL voltage which is obtained from the cell storing the physical 0 data is mathematically equal to Vdd−Vdd×CS/(CS+CBL), where CS and CBL are the storage capacitance and bitline capacitance, respectively. The BL of the BL pair is preferably used for a reference BL for differential sensing. The BL goes low when a reference WL (RWL) goes low due to the capacitive coupling effect. The coupling capacitor 840 should be adjusted so that the reference BL voltage is halfway between the VDD and the BL voltages when a physical 0 data is being read. More particularly, this coupling voltage should be set at Vdd×CS/(CS+CBL)/2 so that reference BL goes low by the amount of the coupling voltage. Optionally, the voltage swing of the RWL can be adjusted. A cross-coupled sense amplifier 830 then amplifies the differential signal developed on the BL pair. This is enabled by making a signal ΦN go low. For a write mode, BL and BL are reversed depending on the data pattern. This allows a new data bit to be written to the storage element 810B. The voltage written to the capacitor 810B is theoretically 0V for writing a data bit of 0, or the wordline boosted voltage minus the threshold voltage of the access transistor 810A for writing a data bit of 1. Optionally, the WL boosted voltage in a write mode can be higher than the WL boosted voltage in a read mode. The WL boosted voltage in a write mode may be originally higher than the WL boosted voltage in a read mode as shown in FIG. 8, case a, or be increased after a sense amplifier has been activated as shown in FIG. 8, case b. After the WL is disabled, the signals ΦN and ΦEQ go high and low respectively, precharging BL and BL to the initial Vdd voltage.

Figure 9:
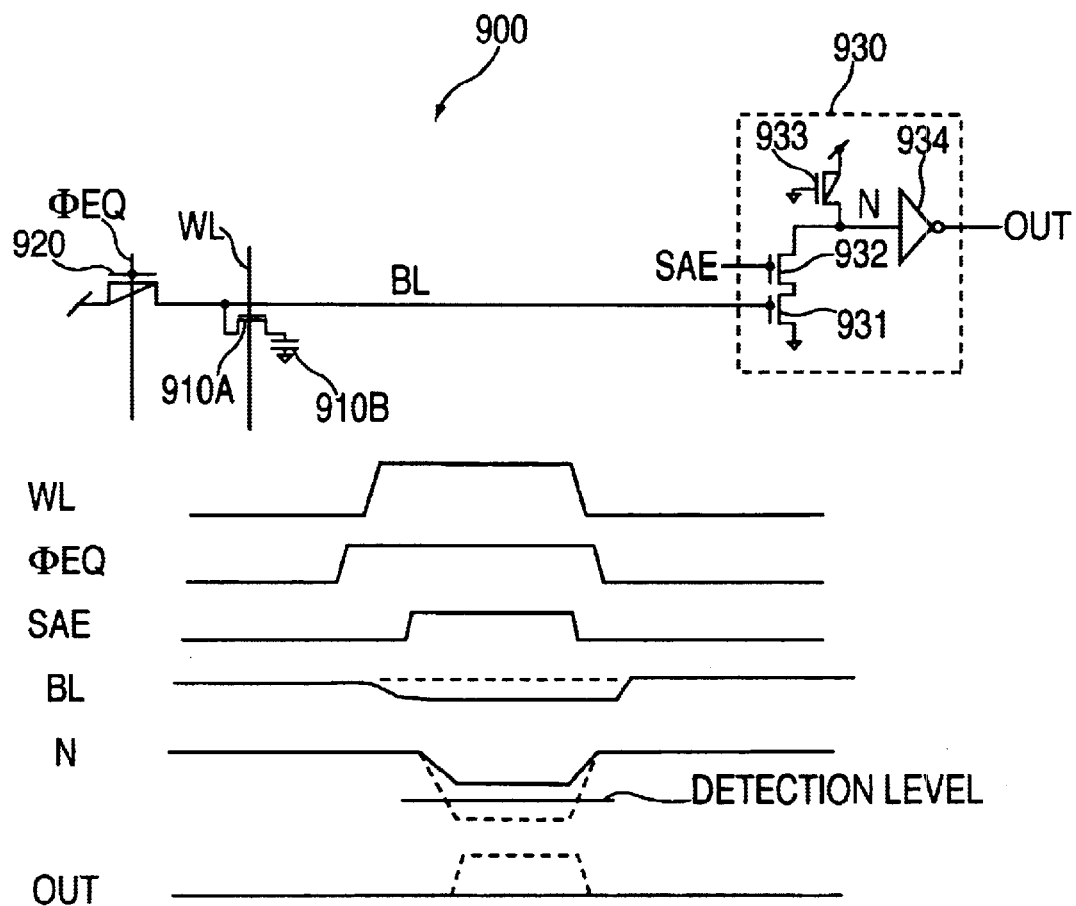
FIG. 9 shows a second preferred embodiment of a transistor schematic diagram of the present invention and waveforms of its operation.

FIG. 9 shows a second preferred embodiment of a transistor schematic diagram of the present invention. A memory array 900 comprises a plurality of memory cells, each consisting of a capacitor as a storage element 910B and a switching transistor 910A. In this example, an NMOS access or swinging transistor is preferably used. The storage element keeps the voltage in a capacitor 910B. More specifically, the storage element stores a physical 1 data (VDD) and a physical 0 data (0V) as a data bit. It is assumed that a physical 1 data is not fully written, but that the physical 0 data is nearly fully written. The storage element 910B couples to a bitline through the switching transistor 910A when the wordline WL goes high. The bitlines are precharged to Vdd through a bitline equalizing PMOS transistor 920. Prior to WL activation, a signal ΦEQ goes high, disabling the BL precharging operation. The WL is then activated.

As discussed previously, a key aspect of the present invention is that a high level of the WL is equal to or lower than the level of an insufficient physical high voltage stored in the storage element 910B plus a threshold voltage of the access transistor. This allows only a voltage for a physical 0 data bit to be transferred to the bitline in a read mode.

In conclusion, the BL maintains Vdd for reading a physical 1 data bit from the cell even if the physical 1 data bit is not fully written to the cell. On the other hand, the BL goes low when the voltage for the physical 0 data is fully transferred, because the gate overdrive for the access gate is sufficient. The BL voltage which is obtained for reading the physical 0 data bit is mathematically equal to Vdd−Vdd× CS/(CS+CBL), where CS and CBL are the storage capacitance and bitline capacitance, respectively.

Unlike the first preferred embodiment, a single BL sensing scheme is preferably used. The single BL sense amplifier 930 consists of only NMOS direct sensing devices 931 and 932. A node N precharged to Vdd through the precharge device 933 is high as long as a signal SAE is low. The signal out is inverted by the inverter 934 and is therefore low. After the WL goes high and the signal has been developed on the bitline BL, the signal SAE goes high. This makes the node N go low. For reading a data bit of 0, the BL goes low, thus maintaining the node N at a nearly high voltage, which maintains the signal OUT at a low voltage. For reading a data bit of 1, the BL maintains the Vdd voltage, making node N go lower. When the node N voltage goes lower than the detection level, shown as DETECTION LEVEL in FIG. 9, of the inverter, the signal OUT goes high.

A fundamental aspect of the present invention is to use only a first voltage for reading and sensing a memory cell by utilizing the threshold voltage of the switching means. This concept is applicable to DRAM, ROM, or any data storage.

FIG. 10 illustrates a summary of the equations explained above and also used in the claims.

While several embodiments and variations of the present invention for a method and configuration to allow a lower wordline boosted voltage operation while increasing a sensing signal with access transistor threshold voltage are described in detail herein, it should be apparent that the disclosure and teachings of the present invention will suggest many alternative designs to those skilled in the art.

What is claimed is:

1. A memory array comprising:
   a plurality of memory cells, each memory cell comprising a data storage element and a switching transistor having a threshold voltage Vth, wherein the data storage element is a capacitor and stores either a nearly full first voltage of a data 0 or an insufficient second voltage of a data 1;
   means for reading the nearly full first voltage of a data 0 through the switching transistor to a bitline while limiting reading the insufficient second voltage of a data 1 by utilizing the threshold voltage Vth of the switching transistor, wherein the switching transistor has a gate connected to a wordline, a drain connected to the bitline, and a source connected to the data storage element, and has the threshold voltage Vth in a read mode, the storage element couples to the bitline through the switching transistor when the wordline goes high, the bitline is precharged to a voltage supply VDD, a wordline boosted voltage is Vpp, wherein the Vpp voltage in a read mode is equal to or smaller than a physical 1 voltage (Vcell-high) written to the memory cell plus the threshold voltage Vth (Vpp=<Vcell-high+Vth), then the bitline maintains the VDD voltage due to the threshold voltage Vth of the switching transistor, and a physical 0 data bit voltage is fully transferred to the bitline because a gate overdrive voltage of the 0 data bit is sufficient to make the bitline go low when the switching transistor conducts, wherein a data bit is sensed by detecting the bitline voltage after signal development, which depends on only a full physical 0 bit in the cell, such that writing a full physical 1 voltage is not necessary as long as a full physical 0 data bit is written and read through the switching transistor.

2. The memory array of claim 1, wherein the switching transistor is an NMOS transistor.

3. The memory array of claim 1, wherein the insufficient second voltage of a data 1 is lower than the bitline precharged voltage VDD.

4. The memory array of claim 1, wherein the wordline boosted voltage in a write mode is higher than the wordline boosted voltage in a read mode.

5. The memory array of claim 3, wherein the insufficient second voltage of a data 1 is not fully read by applying the wordline boosted voltage in a read mode to be equal to or less than the wordline boosted voltage in a write mode.

6. The memory array of claim 1, further comprising a sense amplifier coupled to the bitline, wherein the sense amplifier is a differential cross-coupled sense amplifier coupled to measure a voltage differential across a bitline voltage of the bitline and a reference voltage of a reference bitline.

7. The memory array of claim 6, wherein the reference voltage of the reference bitline is set to a level approximately halfway between the voltage supply VDD and the bitline voltage after the nearly full first voltage is transferred to the bitline in a read mode.

8. The memory array of claim 7, wherein the reference voltage of the reference bitline is set to a voltage approximately equal to VDD−VDD×CS/(CS+CBL)/2, where CS and CBL are a storage capacitance and a bitline capacitance, respectively.

9. The memory array of claim 8, wherein said reference voltage of the reference bitline is set by a reference wordline.

10. The memory array of claim 9, wherein the reference wordline generates the reference voltage of the reference bitline by negatively coupling the reference wordline voltage to the reference bitline which is initially precharged to VDD.

11. The memory array of claim 1, including a single bitline sensing scheme wherein a single bitline sense amplifier comprises only first and second NMOS direct sensing devices having an output node N which is precharged to VDD through a precharge device.

12. The memory array of claim 11, wherein the output node N is high as long as a gate signal to the second NMOS device is low, a signal out of the output node N is inverted by an inverter and is therefore low, and after the wordline goes high and the signal out has been developed on the bitline, the gate signal goes high, which makes the node N go low, for reading a data bit of 0, the bitline goes low, thus maintaining the node N at a nearly high voltage, which maintains the signal out at a low voltage, and for reading a data bit of 1, the bitline maintains the VDD voltage, making the node N go lower and when the node N voltage goes lower than a detection level of the inverter, the signal out goes high.

13. The memory array of claim 1, wherein sensing signals, VSIG-high for a physical data bit 1 and VSIG-low for a physical data bit 0, are VSIGhigh=½VDD×CS/(CS+CBL), and VSIGlow=−½VDD×CS/(CS+CBL), where CBL and CS are respectively the bitline and storage capacitances, such that the sensing signal VSIGhigh does not contain a parameter related to an insufficient storage charge for the physical 1 data bit, allowing an insufficient storage charge for the physical 1 data without reducing a sensing signal.

14. A method of reading a memory array comprised of a plurality of memory cells, each memory cell comprising a data storage element and a switching transistor having a threshold voltage Vth, wherein the data storage element is a capacitor and stores either a nearly full first voltage of a data 0 or an insufficient second voltage of a data 1, the method comprising:
   reading the nearly full first voltage of a data 0 through the switching transistor to a bitline while limiting reading the insufficient second voltage of a data 1 by utilizing the threshold voltage Vth of the switching transistor, wherein the switching transistor has a gate connected to a wordline, a drain connected to the bitline, and a source connected to the data storage element, and has the threshold voltage Vth in a read mode, the storage element couples to the bitline through the switching transistor when the wordline goes high, the bitline is precharged to a voltage supply VDD, a wordline boosted voltage is Vpp, wherein the Vpp voltage in a read mode is equal to or smaller than a physical 1 voltage (Vcell-high) written to the memory cell plus the threshold voltage Vth (Vpp=<Vcell-high+Vth), then the bitline maintains the VDD voltage due to the threshold voltage Vth of the switching transistor, and a physical 0 data bit voltage is fully transferred to the bitline because a gate overdrive voltage of the 0 data bit is sufficient to make the bitline go low when the switching transistor conducts, wherein a data bit is sensed by detecting the bitline voltage after signal development, which depends on only a full physical 0 bit in the cell, such that writing a full physical 1 voltage is not necessary as long as a full physical 0 data bit is written and read through the switching transistor.

15. A DRAM memory array having an array of memory cells, each memory cell comprising a capacitor data storage element and being accessed by a wordline and a bitline and storing a high voltage (Vcell-high) representative of a data 1 and a low voltage representative of a data 0 and having an n-channel switching transistor having a threshold voltage Vth, wherein the switching transistor has a gate connected to the wordline, a drain connected to the bitline, and a source connected to the data storage element, and the data storage element couples to the bitline through the switching transistor when the wordline goes high, and a gate voltage of the switching transistor during a write operation Vwl-w, a wordline read voltage Vwl-r, and a bitline precharge voltage Vbl-pc, wherein the DRAM memory array of memory cells is operated such that:

Vcell-high>Vwl-r−Vth, that is a stored memory cell high voltage is higher than the wordline read voltage less the switching transistor threshold voltage; and Vbl-pc>Vwl-r−Vth[n], that is the bitline precharge voltage is higher than the wordline read voltage less the access transistor threshold voltage;

wherein a data bit is sensed by detecting the bitline voltage after signal development, which depends on only a full data 0 voltage in the cell, such that writing a full data 1 voltage is not necessary as long as a full data 0 voltage bit is written and read through the switching transistor.

* * * * *